(12) United States Patent
Klemmer

(10) Patent No.: US 7,081,789 B2
(45) Date of Patent: Jul. 25, 2006

(54) SWITCHED CAPACITOR CIRCUIT COMPENSATION APPARATUS AND METHOD

(75) Inventor: Nikolaus Klemmer, Cary, NC (US)

(73) Assignee: Telefonaktiebolaget LM Erisson (publ) (SE)

( * ) Notice: Subject to any disclaimer, the term of this patent is extended or adjusted under 35 U.S.C. 154(b) by 149 days.

(21) Appl. No.: 10/746,397

(22) Filed: Dec. 24, 2003

(65) Prior Publication Data

US 2005/0140422 A1    Jun. 30, 2005

(51) Int. Cl.
*H03F 3/04* (2006.01)

(52) U.S. Cl. .................. 327/554; 327/96; 327/362; 330/9

(58) Field of Classification Search .......... 327/94–96, 327/554, 362; 341/143, 155; 330/9, 296
See application file for complete search history.

(56) References Cited

U.S. PATENT DOCUMENTS

| | | | |
|---|---|---|---|
| 5,166,630 A * | 11/1992 | Lee | 327/554 |
| 5,691,720 A * | 11/1997 | Wang et al. | 341/143 |
| 5,909,193 A * | 6/1999 | Phillips et al. | 342/410 |
| 6,073,259 A | 6/2000 | Sartschev et al. | |
| 6,191,637 B1 | 2/2001 | Lewicki et al. | |
| 6,337,601 B1 | 1/2002 | Klemmer | |
| 6,417,728 B1 * | 7/2002 | Baschirotto et al. | 330/9 |
| 6,891,439 B1 * | 5/2005 | Jaehne et al. | 330/296 |

OTHER PUBLICATIONS

Khoury, "On the Design of Constant Settling Time AGC Circuits," IEEE Transactions on Circuits and Systems—II: Analog and Digital Signal Processing, Mar. 1998, pp. 283-294, vol. 45, No. 3.
Klisnick et al., "Dynamic Frequency Compensation Technique for Switched-Capacitor Amplifiers," Electronics Letters, Jun. 25, 1998, pp. 1273-1274, vol. 34, No. 13.

* cited by examiner

*Primary Examiner*—Dinh T. Le
(74) *Attorney, Agent, or Firm*—Coats & Bennett, P.L.L.C.

(57) ABSTRACT

A compensated switched capacitor circuit comprises a switched capacitor circuit and a compensation circuit. The compensation circuit generates a reference current that varies under closed loop control to maintain a targeted slew rate for charging a reference capacitor that is determined by the input clock frequency. The switched capacitor circuit's output amplifier is configured such that its output current varies in proportion to the reference current. Thus, by configuring the reference capacitor to track the effective capacitance of the switched capacitor circuit, the settling time of the switched capacitor circuit may be made relatively insensitive to the value of and changes in the effective capacitance over a range of clock frequencies. The compensation circuit may include a clock reconditioning circuit to ensure that the switched capacitor circuit is clocked at a desired duty cycle.

41 Claims, 7 Drawing Sheets

US 7,081,789 B2

SWITCHED CAPACITOR CIRCUIT COMPENSATION APPARATUS AND METHOD

BACKGROUND OF THE INVENTION

The present invention generally relates to switched capacitor circuits, and particularly relates to compensating such circuits with respect to certain process, temperature, and supply variations.

Switched capacitor circuits form the fundamental building blocks for a variety of circuits, such as Delta-Sigma Analog-to-Digital Converters (ΔΣADCs) and discrete time analog filters. However, while their usage varies widely, all such circuits generally include a core switched capacitor architecture based on Operational Transconductance Amplifiers (OTA) that are configured as integrating amplifiers. This circuit's sampling input is coupled to a sampling capacitor through a first switch, and the sampling capacitor is coupled to an amplifier input through a second switch. That same input typically is coupled to the integration amplifier, which forms the feedback loop of the amplifier.

In a sampling phase, the first switch is closed to sample the input voltage, and the second switch is open to isolate the sampling capacitor from the amplifier. Then, in an integration phase, the first switch is opened to isolate the sampling capacitor from the sampling input, and the second switch is closed to connect the sampling capacitor to the amplifier input. That closure causes the amplifier to generate output current in reaction to the step change in its input voltage caused by closure of the second switch. Essentially, this stage involves the transfer of charge from the sampling capacitor to the integration capacitor.

Settling errors arise if the sampling phase ends before the sampling capacitor has fully charged (or discharged) to the level of the signal being sampled, or if the integration phase ends before completion of charge transfer to the integration capacitor. Such settling errors represent a potentially significant source of non-linear distortion in switched capacitor circuits. In practice, settling errors arise almost inevitably because switched capacitor circuits vary from their nominal or designed-for parameters.

Such variations arise for a variety of reasons, including, but not limited to, changes in the circuit fabrication process or changes in the environmental conditions in which the circuits are used. With circuit fabrication process variations, the switched capacitors can be larger or smaller than intended and/or the OTA's peak output current may be more or less than specified by the design. Environmental changes may include temperature and power-supply induced changes in circuit behavior, and changed behavior resulting from the use of switched capacitor clock frequencies different from the designed-for frequencies or the use of sampling-to-integration phase duty cycles that are not at or around 50%.

SUMMARY OF THE INVENTION

The present invention comprises a method and apparatus to compensate switched capacitor circuits, such as those used in filtering and analog-to-digital conversion functions. In an exemplary embodiment, the output current of a switched capacitor amplifier automatically is adjusted upward or downward as needed to ensure that circuit's settling time remains within the limits set by the clock frequency of the switched capacitor circuit. Thus, an exemplary method of controlling a settling time of a switched capacitor circuit comprises controlling a reference current to increase and decrease as needed to charge a reference capacitor at a targeted slew rate that is set by a clock frequency of the switched capacitor circuit, and generating a charging current that controls the settling slew rate of the switched capacitor circuit to be proportional to the reference current, such that a magnitude of the charging current depends on a capacitance of the reference capacitor and on the clock frequency. The method may further comprise configuring the reference capacitor such that process-related variations in its capacitance track process-related variations in an effective capacitance of one or more switched capacitors driven by the charging current. Similarly, the reference capacitor may be configured such that its environmentally related changes in capacitance track corresponding changes in the effective capacitance of the switched capacitor circuit.

An exemplary circuit according to the present invention comprises a switched capacitor circuit comprising one or more switched capacitors and an amplifier configured to generate an output current proportional to a reference current, wherein a settling time of the switched capacitor circuit depends on an effective capacitance of the one or more switched capacitors as seen by the output current; and further comprises a compensation circuit configured to increase and decrease the reference current as needed to charge a reference capacitor at a targeted slew rate determined by a clock frequency of the switched capacitor circuit. An exemplary compensation circuit comprises a delay locked loop circuit configured to increase the reference current if a detected slew rate of the compensation circuit is less than the targeted slew rate, and to decrease the reference current if the detected slew rate is greater than the targeted slew rate. The exemplary circuit may be implemented as an Integrated Circuit (IC) device, and may be advantageously used wireless communication devices, such as in filters and analog-to-digital converters used in radio base stations and mobile terminals, for example.

DETAILED DESCRIPTION OF THE INVENTION

Figure 1:
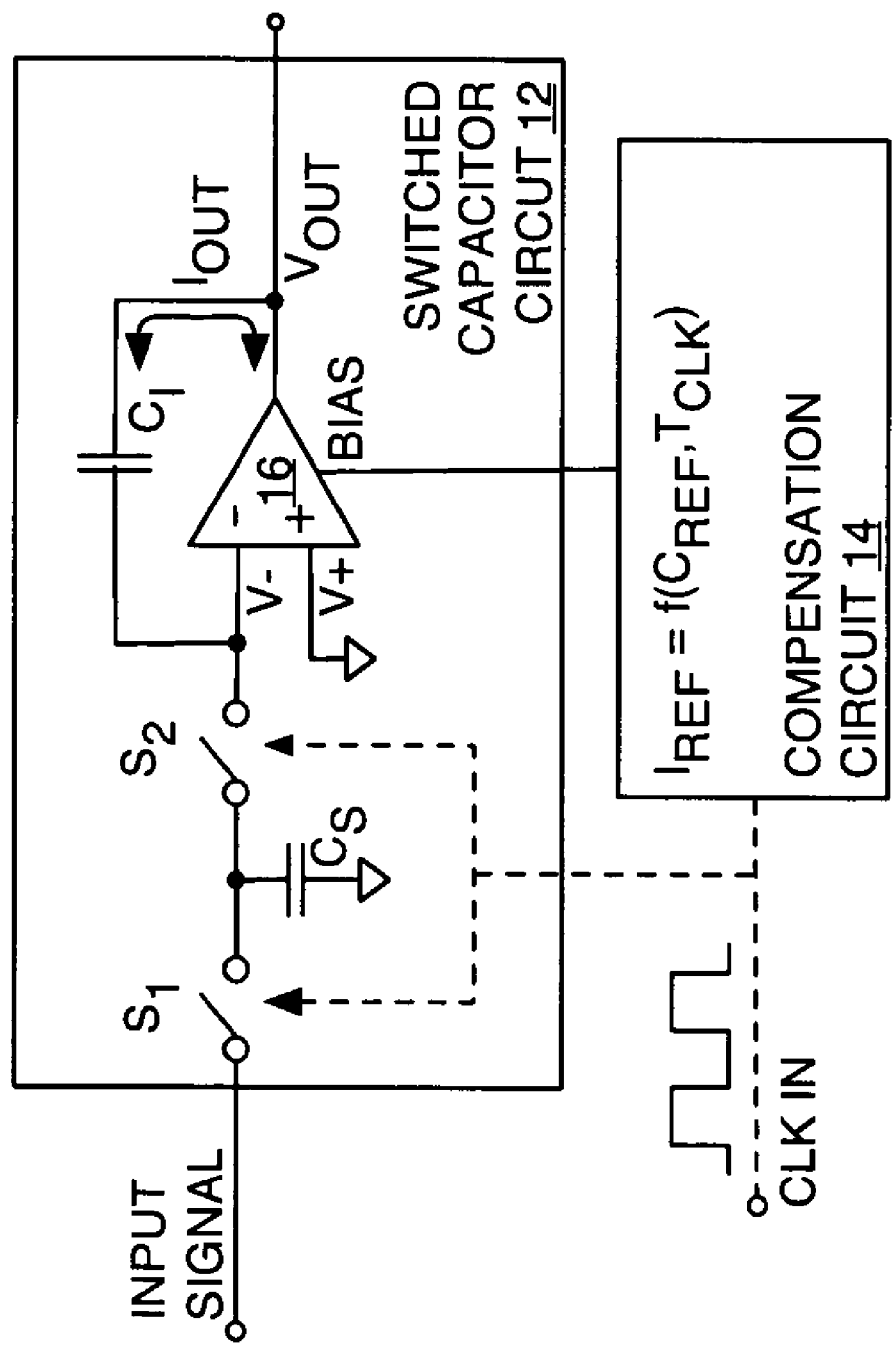
FIG. 1 is a diagram of a switched capacitor circuit and an associated compensation circuit according to an exemplary embodiment of the present invention.

FIG. 1 illustrates a circuit 10 comprising a switched capacitor circuit 12 and an associated compensation circuit 14. Switched capacitor circuit 12 may be configured as part of an Integrated Circuit (IC) for use in signal filtering or analog-to-digital conversion, for example. As is understood by those skilled in the art, switched capacitor circuit 12 operates in a sampling phase, and in an integration phase. In the sampling phase, switch S1 is closed and switch S2 is opened, thus sampling capacitor $C_S$ samples the input signal, i.e., it is charged to the voltage of the input signal. Switch S1 then opens and switch S2 closes, thus placing the switched capacitor circuit 12 in its integration phase, wherein the output current, $I_{OUT}$, from amplifier 16 transfers charge from the sampling capacitor $C_S$ to the integration capacitor $C_I$. Amplifier 16 thus operates as a transconductance amplifier that generates an output current responsive to a differential voltage applied to its (+) and (−) input terminals.

In fact, amplifier 16 drives a maximum $I_{OUT}$ if its input voltage differential is more than a small value, $V_{CLIP}$, that typically is on the order of a few tens of milli-volts. Thus, when circuit 12 switches to its integration phase of operation, the inverting (−) input of amplifier 16 is driven to the sampling voltage on $C_S$, which causes amplifier 16 to drive a maximum $I_{OUT}$ into the effective capacitance formed by the switched capacitors $C_S$ and $C_I$ ($C_{EFF}=(C_S \times C_I)/(C_S+C_I)$). The amplifier's output current thus functions as a charging current that remains at its maximum value after S2 closes until the differential voltage on the inverting (−) and non-inverting (+) inputs is driven back to $V_{CLIP}$, at which point the output current asymptotically falls off as the differential voltage is driven toward zero. The amplifier's output current thus functions like a constant current source that linearly charges the effective capacitance at a slew rate defined by the magnitude of $I_{OUT}$ and the circuit's effective capacitance, $C_{EFF}$.

In conventional switched capacitor circuits, the magnitude of $I_{OUT}$ is fixed. That approach is undesirable because the effective capacitance can vary widely between integrated circuit devices, and particularly between fabrication lots of such devices. If the effective capacitance is smaller than intended, then it takes $I_{OUT}$ a shorter amount of time to charge $C_{EFF}$, thus allowing the circuit to meet its settling time requirements, i.e., charge transfer is completed before the circuit switches back to the next sampling phase. However, if $C_{EFF}$ is larger than intended, which commonly happens where capacitors are fabricated using integrated circuit fabrication processes, then the magnitude of $I_{OUT}$ may not be great enough to complete charge transfer within the required settling time and non-linear settling errors result that cause signal distortion. Similar errors can arise if the clock frequency of the conventional switched capacitor circuit is changed. For example, if the clock frequency is increased, the sampling and integration windows are shortened, thus leaving less time for the circuit to complete charge transfer in the integration phase. Even without a frequency increase, the allowable settling time may be shortened because of a duty cycle imbalance of the switched capacitor circuit's input clock, i.e., long sampling interval followed by a short integration interval or vice versa.

In any case, over-designing the amplifier current represents a common approach to accounting for "worst case" operating conditions of too much capacitance, higher than nominal clocking frequencies, and/or improper duty cycles. The downside to such an approach is relatively high current consumption due to the "oversized" amplifier output current. The present invention addresses that and other shortcomings of conventional switched capacitor circuits by providing in-circuit adjustment of $I_{OUT}$ to account for process, temperature, and supply (PTS) variations. Thus, compensation circuit 14 provides a bias signal to amplifier 16 of switched capacitor circuit 12 that increases or decreases the magnitude of the maximum or peak amplifier output current such that the slew rate of switched capacitor circuit 12 changes as a function of input clock frequency and, for a given clock frequency, is maintained over a wide range of effective capacitance.

Figure 2A:
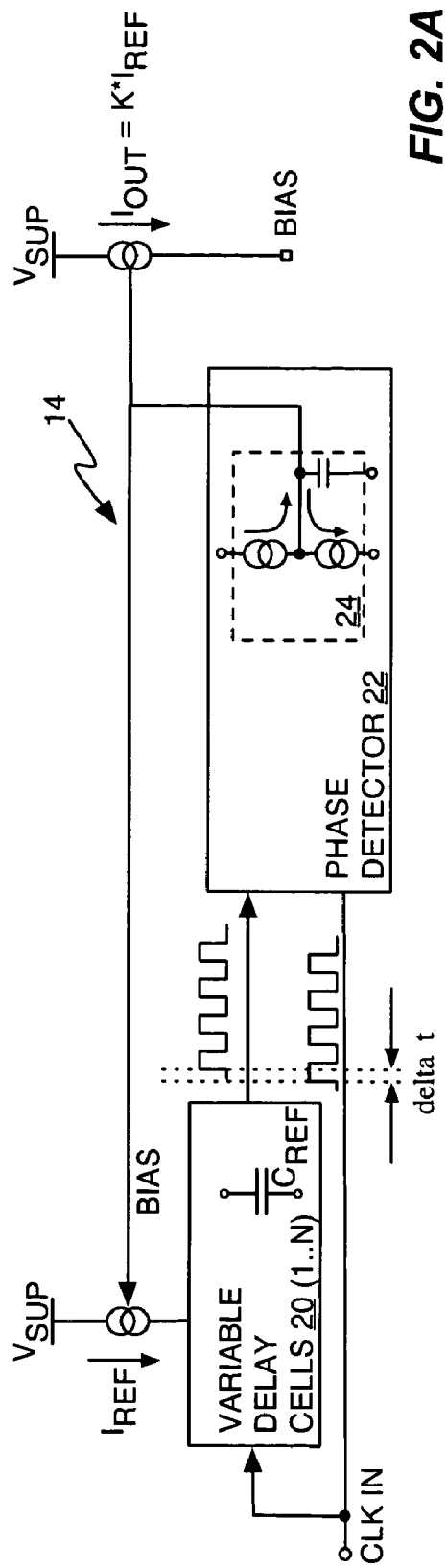
FIGS. 2A and 2B are diagrams of an exemplary delay locked loop implementation of the compensation circuit of FIG. 1.
Figure 2B:
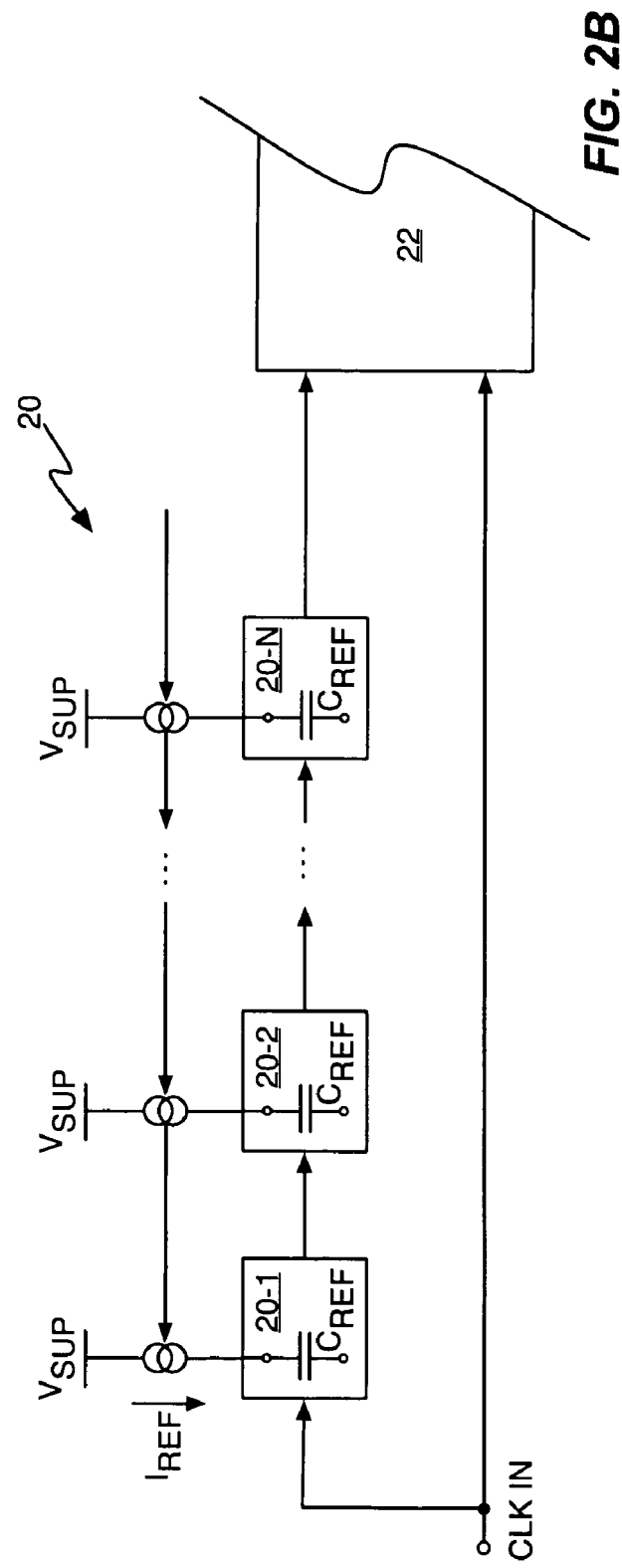

As illustrated in FIGS. 2A and 2B, compensation circuit 14 comprises variable delay cells 20 and a phase detector 22 that includes an output circuit 24 that generates the bias signal as a function of the phase difference between corresponding edges in an input clock signal and a delayed version of the clock signal as provided by variable delay cell 20. In operation, an input clock signal, i.e., the clock signal to be used for the switched capacitor circuit 12, is input to the variable delay cell 20 and to the phase detector 22. Variable delay cell 20 outputs a delayed version of the clock signal that serves as the other input to phase detector 22. The bias signal output from phase detector 22 thus varies as a function of the phase error between corresponding edges (rising or falling) in the input clock signal and the delayed clock signal.

The bias signal is used to set the magnitude of a reference current $I_{REF}$ that charges a reference capacitor, $C_{REF}$, and the compensation circuit 14 is configured such that the bias signal increases or decreases under closed loop control such that the magnitude of $I_{REF}$ is driven to the value needed to charge $C_{REF}$ to a target voltage $V_{REF}$ within one clock time of the input clock signal. That is, the delay of the variable delay cell 20 is driven to a one period delay of the input clock signal, and the corresponding magnitude of $I_{REF}$ is the value needed to charge the reference capacitor $C_{REF}$ to the target voltage $V_{REF}$ within that delay period. As such, the value of $I_{REF}$ is driven to that needed to achieve a targeted slew rate that depends on the capacitance of $C_{REF}$ and on the input clock frequency. Thus, $I_{REF}$ is generated as, $$I_{REF} = \frac{V_{REF} C_{REF}}{T}, \qquad (1)$$

where T is the input clock period or some portion thereof. With this relationship, then, the value of $I_{OUT}$ is determined as, $$I_{OUT}=f(I_{REF})=k \cdot I_{REF}. \qquad (2)$$

Of course, one may configure circuit 10 such that $I_{REF}$ and $I_{OUT}$ take on nominal values corresponding to a nominal operating frequency, nominal capacitance values, and nominal supply voltages and temperatures. Thus, one may set $V_{REF}$ such that $I_{REF}$ and $I_{OUT}$ have desired nominal magnitudes for a given nominal frequency and nominal reference and effective capacitances according to, $$V_{REF} = \frac{I_{REF} T}{C_{REF}}, \qquad (3)$$

or set $V_{REF}$ to a well controlled value, such as a bandgap voltage.

Figure 3:
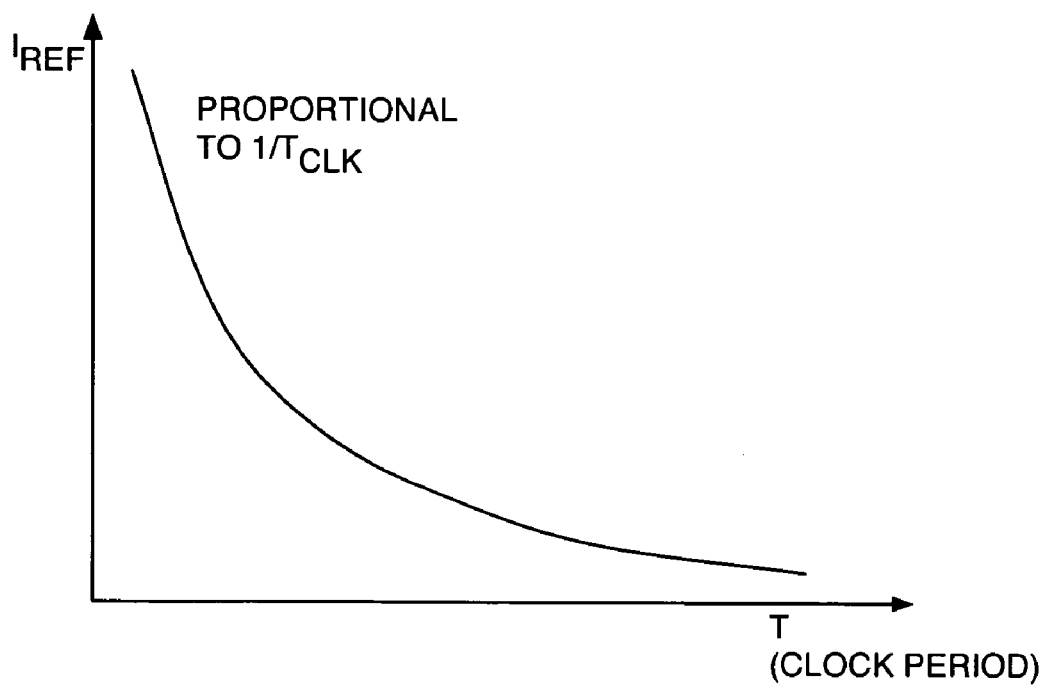
FIGS. 3 and 4 are graphs illustrating control of the compensation circuit's reference current as functions of the switched capacitor clock frequency and the capacitance of a reference capacitor.
Figure 4:
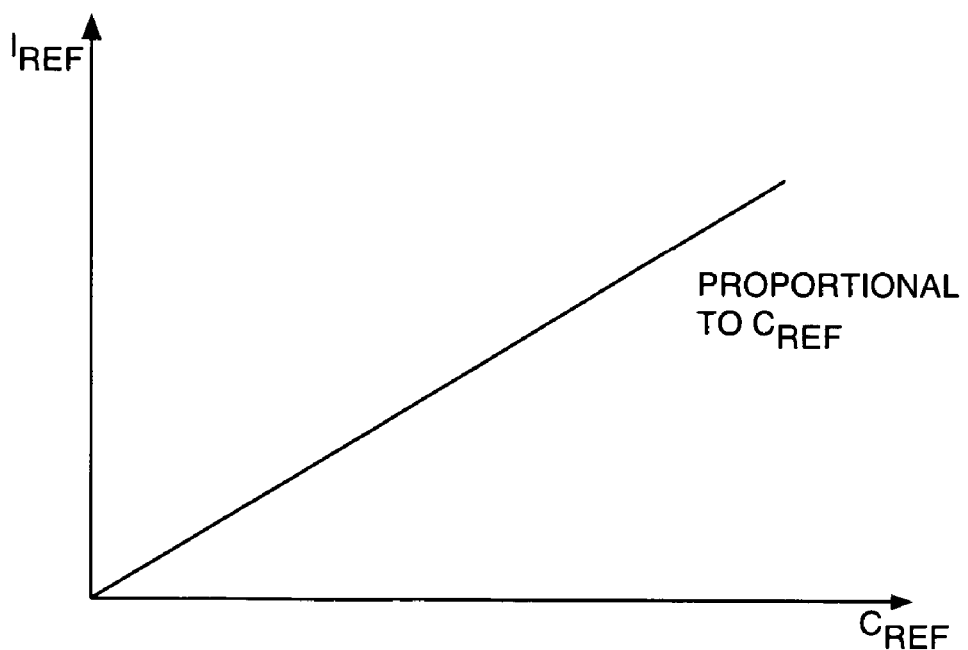

FIGS. 3 and 4 graphically depict the relationship of $I_{REF}$ to the input clock frequency and to the capacitance of $C_{REF}$. For example, in FIG. 3, one sees that the magnitude of $I_{REF}$ decreases with an increasing clock period, i.e., as the frequency of the switched capacitor circuit's input clock decreases, the required slew rate is reduced and the magnitude of $I_{REF}$ correspondingly decreases. Conversely, in FIG.

4, one sees that the magnitude of $I_{REF}$ increases with increasing reference capacitance. That is, for a given clock frequency, the magnitude of $I_{REF}$ increases to maintain the targeted slew rate if the capacitance of $C_{REF}$ increases and decreases if the capacitance of $C_{REF}$ decreases.

Such variations in capacitance are commonplace in the semiconductor fabrication process. As is well understood by those skilled in the art, controlling the absolute value of capacitors fabricated within semiconductor devices is quite difficult. Thus, the absolute values of $C_{REF}$, $C_I$, and $C_S$ all may change significantly from wafer to wafer, or even from device to device. However, the ratio of one capacitor to another within a given device can be well controlled. Thus, the designer can ensure that $C_{REF}$ maintains a closely fixed relationship to the integration and sampling capacitors, $C_I$ and $C_S$. In other words, if $C_S$ and $C_I$ are larger than their nominal values, e.g., 120 pF rather than 100 pF, then $C_{REF}$ will be larger than its nominal value by the same factor (1.2). Likewise, if the capacitance of $C_I$ and $C_S$ is less than nominal, the capacitance of $C_{REF}$ will be less than its nominal value by the same factor.

Such tracking between $C_{REF}$ and $C_I/C_S$ is accomplished by maintaining a known geometric scaling between the capacitors and by implementing $C_{REF}$ in the same device layers (i.e., the same metal and oxide layers of the semiconductor device). By using the same chip layers, $C_{REF}$ is subject to the same variations in oxide thickness, etc., as are the switched capacitors $C_I$ and $C_S$. Such matching also results in good environmental tracking between $C_{REF}$ and the switched capacitors $C_I$ and $C_S$. That is, changes in the capacitance of $C_{REF}$ track changes in the capacitance of $C_I$ and $C_S$ over changes in operating temperature and voltage.

Figure 5:
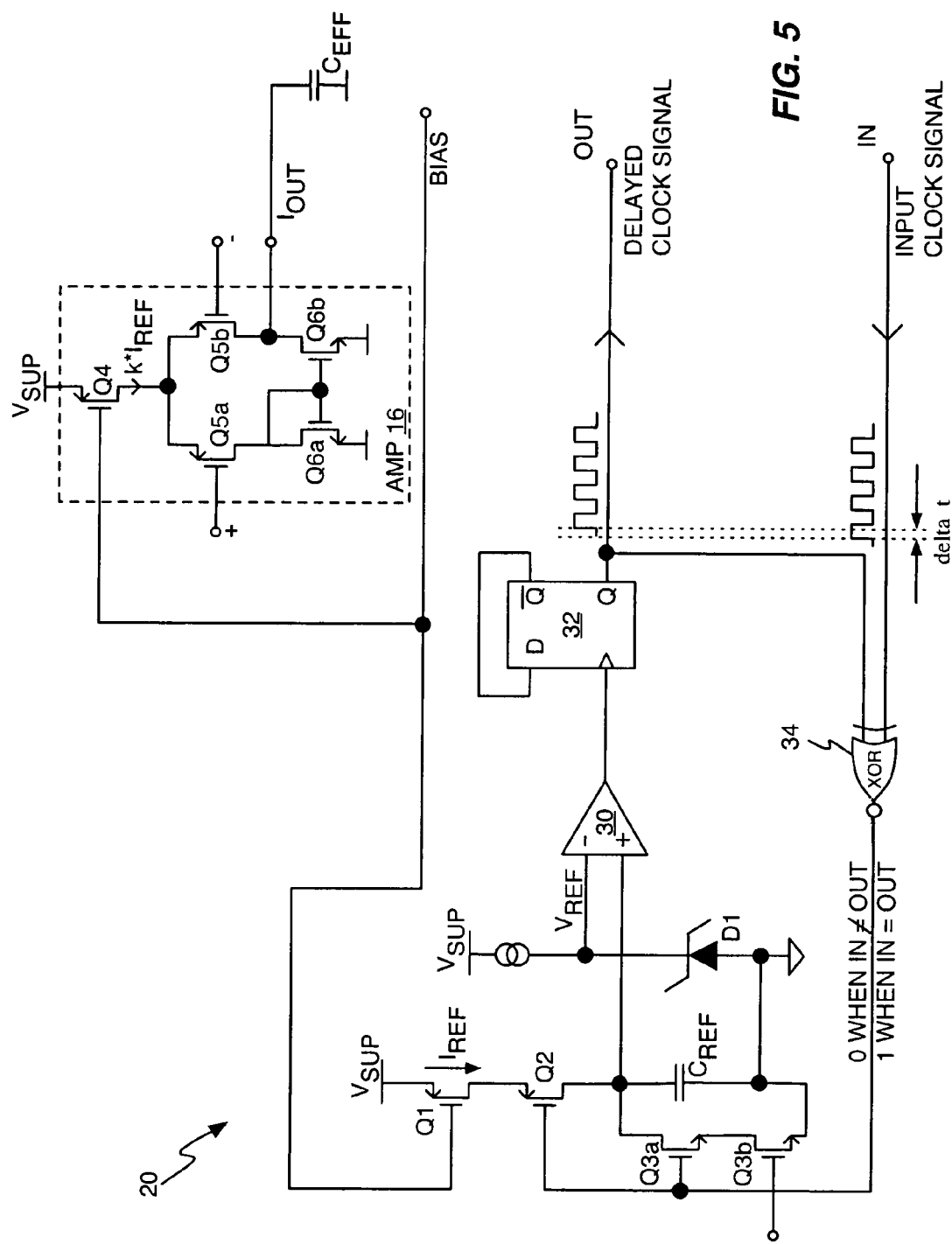
FIG. 5 is a diagram of exemplary variable delay cell for use in the delay locked loop of FIGS. 2A and 2B.

FIG. 5 illustrates an exemplary configuration for the variable delay cell 20, and further illustrates an exemplary differential pair arrangement for amplifier 16. Delay cell 20 comprises a comparator 30, a D flip-flop (DFF) 32, an exclusive-nor (XNOR) gate 34, transistors Q1, Q2, and Q3a/Q3b, and a bandgap voltage reference D1. Note that other voltage reference types may be used, and that D1 may be omitted and an input port provided such that $V_{REF}$ is received from an external source. An exemplary amplifier 16 comprises differential pairs of transistors Q5a/Q5b and Q6a/Q6b.

Regardless, in operation, the input clock signal is applied to one input of XNOR gate 34, and its other input is tied to the "Q" output of DFF 32. The output from XNOR gate 34 directly or indirectly drives the gates of transistors Q2 and Q3a. If the output of XNOR gate 34 is high ("1"), Q2 is turned off and Q3a is turned on. In that state, $C_{REF}$ is grounded and no current flows into it. Thus, the non-inverting input (+) of comparator 30 remains below its inverting input (−), which is at $V_{REF}$. Thus, when the output of XNOR gate 34 switches low ("0"), Q2 turns on Q3a turns off, and $C_{REF}$ begins charging at a rate determined by the magnitude of $I_{REF}$ flowing through Q1, which is set by the value of the bias signal provided by phase detector circuit 22. Note that Q3b may be used as an enabling or gating device for discharging $C_{REF}$ and may or may not be included.

When $C_{REF}$ charges up to about $V_{REF}$, the output of comparator 30 changes state, which clocks DFF 32, which in turn changes the output state of DFF 32. The output of DFF 32 serves as the delayed version of the clock signal and thus drives back into XNOR gate 34 and into one of the phase inputs of phase detector 22. With this arrangement, if DFF 32 clocks early (less than one clock cycle between input and delayed clock signals), the bias signal increases, which lowers the gate-to-source voltage of Q1 and thus decreases the magnitude of $I_{REF}$ and thereby reduces the slew rate of the voltage on $C_{REF}$. Conversely, if DFF 32 clocks late, the bias signal decreases, which increases the gate-to-source voltage on Q1 and thus increases the magnitude of $I_{REF}$ and thereby increases the slew rate of the voltage on $C_{REF}$.

With this arrangement, $I_{REF}$ increases if the value of $C_{REF}$ increases because it takes a greater magnitude of $I_{REF}$ to maintain the targeted slew rate with increasing $C_{REF}$. Similarly, if the input clock frequency increases, the clock period decreases and it takes a greater magnitude of $I_{REF}$ to charge $C_{REF}$ to $V_{REF}$ within the shortened clock period. Of course, if the frequency decreases and/or $C_{REF}$ decreases, $I_{REF}$ is reduced a proportionate amount. Thus, compensation circuit 14 varies $I_{REF}$ as needed to maintain a targeted slew rate that is set by the input clock frequency, wherein the targeted slew rate is defined as the rate needed to charge $C_{REF}$ to $V_{REF}$ within the allotted time, i.e., within one cycle delay time.

By tying the bias input of amplifier 16 to the same bias signal as controls $I_{REF}$, the output current $I_{OUT}$ of amplifier 16 may be made to vary as a function of $I_{REF}$. Thus, by scaling the biasing transistor Q4 of amplifier 16 in known relationship to Q1, which itself may comprise a composite transistor circuit, the value of $I_{OUT}$ increases or decreases in relation to $I_{REF}$ by a factor that accounts for the relationship between $C_{REF}$ and $C_{EFF}$. If $C_{REF}$ equals $C_{EFF}$, then a one-to-one scaling of $I_{OUT}$ to $I_{REF}$ may be desired, but those skilled in the art will recognize that essentially any desired proportionality can be configured based on setting the relative device sizes.

This exemplary method establishes the slew rate of amplifier 16 as, $$SlewRate = \frac{I_{OUT}}{C_{EFF}} = \left(\frac{C_{REF}}{C_{EFF}}\right) N V_{REF} f_s, \quad (4)$$

where N equals the number of unit delays cells in the variable delay cell 20, and where $f_s$ equals the frequency of the input clock signal.

According to the above exemplary details, compensation circuit 14 adjusts $I_{REF}$ as needed to maintain a targeted slew rate that is determined by the switched capacitor circuit's clock frequency. For a given clock frequency $I_{REF}$ increases and decreases as needed to charge $C_{REF}$ at the targeted slew rate and the slew rate is thus maintained over a range of $C_{REF}$ capacitance. The output current $I_{OUT}$ of amplifier 16 is made to change in proportion to $I_{REF}$ and, thus, if the capacitance of $C_{REF}$ tracks the effective capacitance driven by $I_{OUT}$, then the settling time of switched capacitor 12 will be maintained irrespective of whether $C_I$ and $C_S$ are bigger or smaller than their designed-for sizes and irrespective of whether their capacitance changes over time and temperature.

Of course, the delay cell 20 of FIG. 5 assumed that the input clock signal had a duty cycle close to fifty-percent. If the actual input clock signal deviates too far from a fifty-percent duty cycle, then the actual allowable settling time of the switched capacitor circuit 12 may be significantly shorter than used by the delay cell 20 to set the targeted slew rate. Therefore, an alternative exemplary embodiment of the present invention includes input clock reconditioning to ensure that the switched capacitor circuit 12 operates with a clock signal that has a desired duty cycle, e.g., a fifty-percent duty cycle.

Figure 6:
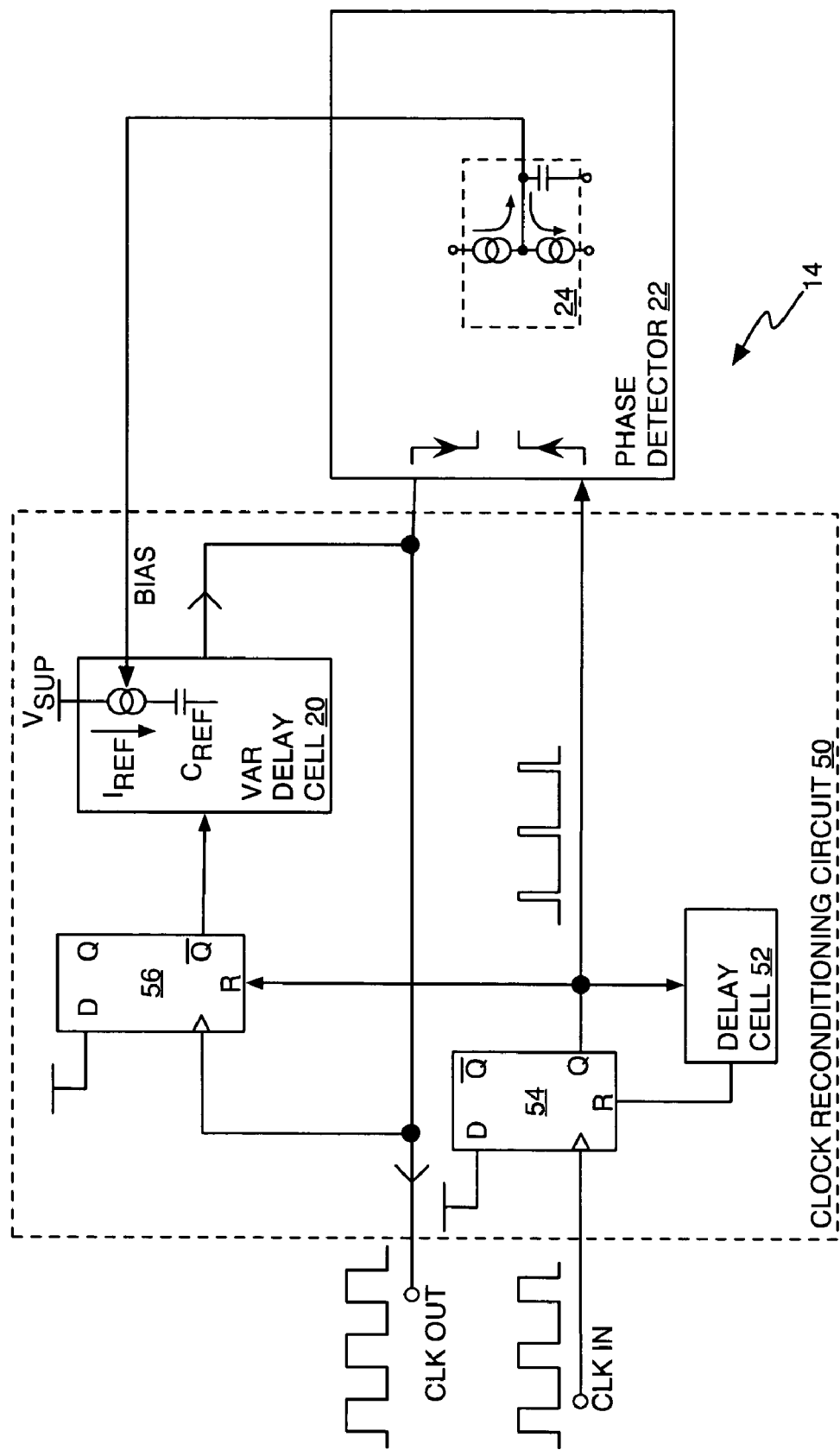
FIG. 6 is a diagram of an exemplary delay locked loop that includes clock duty cycle regeneration.

FIG. 6 illustrates an alternate embodiment of compensation circuit 14, wherein a clock reconditioning circuit 50 drives the phase detector 22. Circuit 50 comprises the previously illustrated variable delay cell 20, and another delay cell 52, which may be implemented with a short fixed or variable delay. Circuit 50 further comprises DFFs 54 and 56. In operation, circuit 50 generates a reconditioned output clock signal that has the same frequency as the input clock signal but with essentially any desired duty cycle that is independent of the input clock signal's duty cycle.

The input clock signal, i.e., the clock signal with to-be-reconditioned duty cycle intended for switched capacitor circuit 12, clocks DFF 54. The output of DFF 54 serves as an input to delay cell 52, which provides a delayed output edge for every input edge it receives. The delayed edge serves as a reset input to DFF 54 and, thus, DFF 54 generates relatively narrow output pulses responsive to the incoming train of input clock pulses—the width of its output pulses is determined by the delay of delay cell 52 and various propagation delays. The output of DFF 54 also drives one phase input of phase detector 22, and drives the reset input of DFF 56. The output of DFF 56 in turn drives the clock input of variable delay cell 20 (see FIG. 2A or FIG. 5). The clock output of variable delay cell 20 drives the other phase input of phase detector 22, feeds back as the clock input of DFF 56, and serves as the reconditioned clock signal output. With this approach, the duty cycle of the clock output signal will be 50% if the variable delay cell 20 delays rising and falling edges of its input signal by an equal amount. Any other duty cycle of the clock output signal can be accomplished by delaying rising and falling edges by unequal amounts. The switches $S_1$ and $S_2$ in the switched capacitor circuit will be controlled by the clock out (CLOCK OUT) signal.

Figure 7:
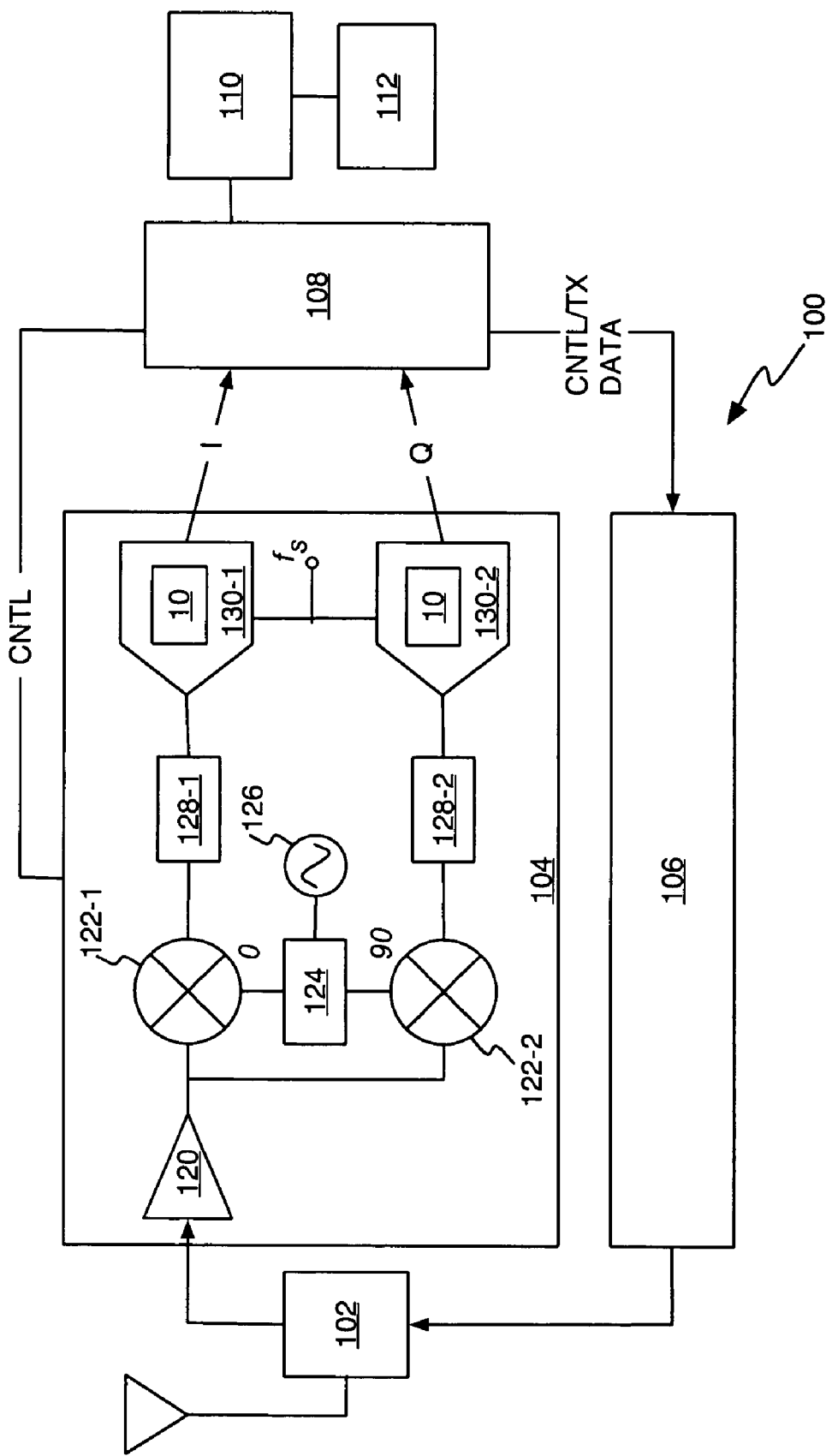
FIG. 7 is a diagram of an exemplary mobile terminal according to one or more embodiments of the present invention.

Whether or not clock reconditioning is used, the combination of switched capacitor circuit 12 with compensation circuit 14 is useful in a broad range of circuit devices, including the previously mentioned filtering and analog-to-digital conversion applications. FIG. 7 illustrates a mobile terminal 100 for use in a wireless communication network and depicts an exemplary embodiment of the present invention applied to the received signal processing chain of the mobile terminal 100. The illustrated mobile terminal 100 comprises an antenna assembly 102, a receiver circuit 104, a transmitter circuit 106, a baseband processor 108, a system controller 110, and a user interface 112 (e.g., keypad, display, speakers, etc.). As used herein, it should be understood that the term "mobile terminal" is given broad construction and means wireless communication handsets, e.g., cellular radiotelephones, Portable Digital Assistants (PDAs), laptop/palmtop computers, etc. Broadly, the term mobile terminal as used herein refers to any type of so-called "pervasive communication device."

In operation, radio signals received via antenna assembly 102 are input to a low noise amplifier 120, and the resultant signal is split into in-phase (I) and quadrature (Q) signal streams via quadrature mixers 122-1 and 122-2, based on a local oscillator frequency provided by frequency synthesizer 126. The down-mixed I and Q signals are then passed through filters 128-1 and 128-2, respectively, for input to sampling ADCs 130-1 and 130-2. In an exemplary embodiment, ADCs 130 each include one or more compensated switched capacitor circuits 10 according to the present invention. The ADCs 130 generate digitized I and Q signal samples that are provided to baseband processor 108 for received signal processing, e.g., demodulation/decoding operations.

In this embodiment, the ADCs 130 may be fabricated as part of a radio receiver circuit that includes one or more ICs. As such, the compensated switched capacitor circuits 10 may be fabricated as part of a mixed signal ASIC or other IC that is used to implement receiver circuit 104. In that manner, the compensated switched capacitor circuits 10 reduce errors in the analog-to-digital conversion process by adjusting their charging currents as needed to ensure that the appropriate settling times are maintained over a range of operation conditions, irrespective of whether the effective circuit capacitances are more or less than their nominal values.

By adjusting their charging currents up or down to hit the targeted settling time as a function of effective capacitance and input clock frequency, the compensated switched capacitor circuits 10 obviate the need to maintain unnecessarily high charging currents that would otherwise be needed to ensure proper settling time performance under worst case conditions. As such, the use of the compensated switched capacitor circuits 10 in mobile terminal 100 reduce its overall power consumption and thereby improve battery life in addition to reducing received signal processing errors.

Figure 8:
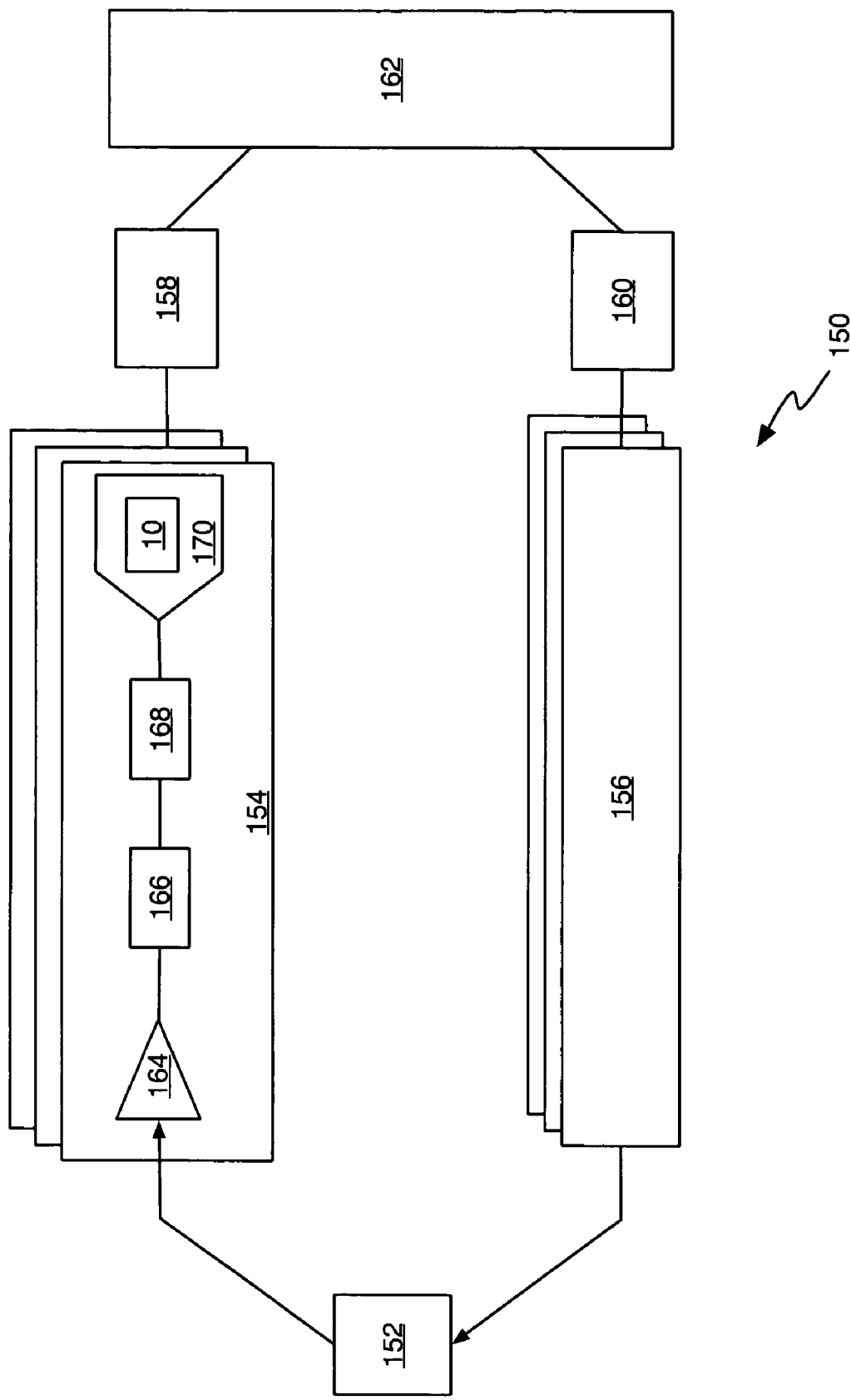
FIG. 8 is a diagram of an exemplary radio base station according to one or more embodiments of the present invention.

Of course, the present invention may be embodied elsewhere in mobile terminal 100, such as anywhere that switched capacitor filters or other switched capacitor circuits are used. Indeed, the present invention may be embodied in network radio base stations in their filtering and/or analog-to-digital conversion circuits. In FIG. 8, a radio base station 150 comprises transmit/receive antennas 152, receiver circuits 154, transmitter circuits 156, reverse link signal processing circuits 158, forward link signal processing circuits 160, and a base station controller interface circuit 162. Receiver circuits 154 includes pluralities of received signal processing changes that may be used to receive the individual signals from a plurality of mobile stations, wherein each received signal processing chain includes amplifiers 164, mixer circuits 166, filter circuits 168, and one or more ADCs 170 that include one or more compensated switched capacitor circuits 10 according to one or more embodiments of the present invention.

More broadly, the present invention can be embodied in essentially any type of device that uses some form of switched capacitor circuits. As such, the present invention is not limited by the foregoing discussion but rather is limited by the following claims and the reasonable equivalents thereof.

What is claimed is:

1. A method of controlling a settling time of a switched capacitor circuit, wherein the settling time depends at least on an amplifier output current and an effective capacitance seen by the amplifier output current, the method comprising:
   generating a reference current that varies in proportion to a reference capacitance;
   configuring the reference capacitance such that changes in the reference capacitance are substantially similar to changes in the effective capacitance; and
   generating the amplifier output current proportional to the reference current.

2. The method of claim 1, wherein generating the reference current that varies in proportion to the reference capacitance comprises generating the reference current under closed-loop control such that an increase in the reference capacitance causes a corresponding increase in the reference current, and a decrease in the reference capacitance causes a corresponding decrease in the reference current.

3. The method of claim 2, wherein generating the reference current under closed-loop control comprises configuring a delay lock loop circuit to increase or decrease the reference current as needed to charge the reference capacitor to a reference voltage in a defined cycle time.

4. The method of claim 3, further comprising clocking the delay lock loop circuit at a clock frequency of the switched capacitor circuit such that the reference current changes in inverse proportion to the clock frequency of the switched capacitor circuit.

5. The method of claim 4, further comprising receiving an input clock signal intended for the switched capacitor circuit, generating a conditioned clock signal at a frequency of the input clock signal but with a desired duty cycle, and clocking the switched capacitor circuit with the conditioned clock signal.

6. The method of claim 5, further comprising clocking a delay cell of the delay lock loop with the conditioned clock signal such that generation of the reference current depends on the duty cycle of the conditioned clock signal.

7. The method of claim 1, wherein configuring the reference capacitance such that changes in the reference capacitance are substantially similar to changes in the effective capacitance comprises fabricating a reference capacitor that sets the reference capacitance to have substantially the same physical and electrical properties as one or more switched capacitors in the switched capacitor circuit that set the effective capacitance.

8. The method of claim 1, further comprising generating the reference current such that it further varies in proportion to a clock frequency of the switched capacitor circuit, and such that the reference current and the amplifier output currents increase with increasing clock frequency and decrease with decreasing clock frequency.

9. A method of controlling a settling time of a switched capacitor circuit, the method comprising:
controlling a reference current to increase and decrease as needed to charge a reference capacitor at a targeted slew rate that is set by a clock frequency of the switched capacitor circuit; and
generating a charging current that controls the settling time of the switched capacitor circuit to be proportional to the reference current, such that a magnitude of the charging current depends on a capacitance of the reference capacitor and on the clock frequency.

10. The method of claim 9, further comprising configuring the reference capacitor such that process-related variations in its capacitance track process-related variations in an effective capacitance of one or more switched capacitors driven by the charging current.

11. The method of claim 9, further comprising configuring the reference capacitor such that environmentally-related variations in its capacitance track environmentally-related variations in an effective capacitance of one or more switched capacitors driven by the charging current.

12. The method of claim 9, wherein controlling the reference current to increase and decrease as needed to charge the reference capacitor at the targeted slew rate that is set by the clock frequency of the switched capacitor circuit comprises:
charging the reference capacitor via the reference current in a time window defined by a delay between a first clock signal at the clock frequency and a delayed version of the first clock signal;
generating an error signal corresponding to an error between a reference voltage and an ending voltage of the reference capacitor reached during charging; and
adjusting the delay to reduce the error.

13. The method of claim 12, wherein controlling the reference current to increase and decrease as needed to charge the reference capacitor at the targeted slew rate that is set by the clock frequency of the switched capacitor circuit comprises biasing a first transistor circuit via the error signal.

14. The method of claim 13, wherein generating the charging current that controls the settling time of the switched capacitor circuit to be proportional to the reference current comprises biasing a second transistor circuit via the error signal, wherein the second transistor circuit forms an amplifier in the switched capacitor circuit that outputs the charging current.

15. The method of claim 14, further comprising configuring the first and second transistor circuits to set a desired scaling between the reference and charging currents.

16. The method of claim 9, further comprising receiving an input clock signal at the clock frequency and with a first duty cycle, generating a conditioned clock signal at the clock frequency and with a controlled duty cycle, and clocking the switched capacitor circuit with the conditioned clock signal.

17. The method of claim 16, further comprising setting the targeted slew rate based on the controlled duty cycle of the conditioned clock signal.

18. A circuit comprising:
a switched capacitor circuit comprising one or more switched capacitors operatively connected to a first input of an amplifier, said amplifier configured to generate an output current proportional to a reference current, and wherein a settling time of the switched capacitor circuit depends on an effective capacitance of the one or more switched capacitors as seen by the output current; and
a compensation circuit comprising a reference capacitor, said compensation circuit operatively connected to a second input of the amplifier and configured to increase and decrease the reference current as needed to charge the reference capacitor at a targeted slew rate determined by a clock frequency input to the switched capacitor circuit.

19. The circuit of claim 18, wherein the compensation circuit comprises a delay locked loop circuit configured to increase the reference current if a detected slew rate of the compensation circuit is less than the targeted slew rate, and to decrease the reference current if the detected slew rate is greater than the targeted slew rate.

20. The circuit of claim 19, wherein the delay locked loop comprises:
a variable delay cell that generates a delayed clock signal from an input clock signal; and
a phase detector circuit that generates a bias signal as a function of a phase error between clock edges in the input clock signal the delayed clock signal.

21. The circuit of claim 20, wherein the amplifier in the switched capacitor circuit comprises a first transistor amplifier, and wherein the compensation circuit further comprises a second transistor amplifier that has a known device scaling relative to the first transistor amplifier, and wherein the bias signal biases both the first and second transistor amplifiers.

22. The circuit of claim 20, wherein the delay cell comprises a delay control input that receives the bias signal such that a delay of the delay cell adjusts responsive to the bias signal.

23. The circuit of claim 19, wherein the compensation circuit further comprises a clock regeneration circuit configured to receive an input clock signal at an input clock frequency and with an unknown duty cycle, and to generate an output clock signal at the input clock frequency and with a desired duty cycle, and wherein the clock regeneration circuit further comprises a clock output coupled to the switched capacitor circuit such that the output clock signal clocks the switched capacitor circuit.

24. The circuit of claim 18, wherein the switched capacitor circuit comprises a portion of a radio receiver circuit.

25. The circuit of claim 24, wherein the radio receiver circuit comprises an analog-to-digital converter, and wherein the switched capacitor circuit comprises a sampling portion of the analog-to-digital converter.

26. The circuit of claim 18, wherein the switched capacitor circuit comprises an Integrated Circuit (IC) device, and wherein the reference capacitor comprises a replica of the one or more switched capacitors.

27. The circuit of claim 18, wherein the compensation circuit comprises a transistor circuit configured to generate the reference current, wherein the transistor circuit is fabricated according to a desired device scaling relative to the amplifier in the switched capacitor circuit.

28. A mobile terminal for use in a wireless communication network comprising:
  a transmitter to transmit signals to the network;
  a receiver to receive signals from the network; and
  wherein said receiver comprises an analog-to-digital converter configured to generate received signal samples from the received signals, and wherein the analog-to-digital converter comprises:
    a switched capacitor circuit comprising one or more switched capacitors operatively connected to an input of an amplifier, said amplifier configured to generate an output current proportional to a reference current, and wherein a settling time of the switched capacitor circuit depends on an effective capacitance of the one or more switched capacitors as seen by the output current; and
    a compensation circuit comprising a reference capacitor, said compensation circuit operatively connected to the amplifier and configured to increase and decrease the reference current as needed to charge a reference capacitor at a targeted slew rate determined by a clock frequency input to the switched capacitor circuit.

29. The mobile terminal of claim 28, wherein the compensation circuit comprises a delay locked loop circuit configured to increase the reference current if a detected slew rate of the compensation circuit is less than the targeted slew rate, and to decrease the reference current if the detected slew rate is greater than the targeted slew rate.

30. The mobile terminal of claim 29, wherein the delay locked loop comprises:
  a variable delay cell configured to generate a delayed clock signal from an input clock signal; and
  a phase detector circuit configured to generate a bias signal as a function of a phase error between clock edges in the input clock signal and the delayed clock signal.

31. The mobile terminal of claim 30, wherein the delay cell comprises a delay control input that receives the bias signal such that a delay of the delay cell adjusts responsive to the bias signal.

32. The mobile terminal of claim 30, wherein the amplifier in the switched capacitor circuit comprises a first transistor amplifier, and wherein the compensation circuit further comprises a second transistor amplifier that has a known device scaling relative to the first transistor amplifier, and wherein the bias signal biases both the first and second transistor amplifiers.

33. The mobile terminal of claim 29, wherein the compensation circuit further comprises a clock regeneration circuit configured to receive an input clock signal at an input clock frequency and with an unknown duty cycle, and to generate an output clock signal at the input clock frequency and with a desired duty cycle, and wherein the clock regeneration circuit further comprises a clock output coupled to the switched capacitor circuit such that the output clock signal clocks the switched capacitor circuit.

34. The mobile terminal of claim 28, wherein the circuit comprises a portion of a radio receiver circuit.

35. The mobile terminal of claim 34, wherein the radio receiver circuit comprises an analog-to-digital converter, and wherein the circuit comprises a sampling portion of the analog-to-digital converter.

36. A radio base station for use in a wireless communication network comprising:
  transmitter circuits to transmit signals to a plurality of mobile terminals;
  receiver circuits to receive signals from a plurality of mobile terminals; and
  wherein said receiver circuits comprise one or more analog-to-digital converters, each configured to generate received signal samples from a received signal, and wherein each analog-to-digital converter comprises:
    a switched capacitor circuit comprising one or more switched capacitors operatively connected to an input of an amplifier, said amplifier configured to generate an output current proportional to a reference current, and wherein a settling time of the switched capacitor circuit depends on an effective capacitance of the one or more switched capacitors as seen by the output current; and
    a compensation circuit comprising a reference capacitor, said compensation circuit operatively connected to the amplifier and configured to increase and decrease the reference current as needed to charge a reference capacitor at a targeted slew rate determined by a clock frequency input to the switched capacitor circuit.

37. The radio base station of claim 36, wherein the compensation circuit comprises a delay locked loop circuit configured to increase the reference current if a detected slew rate of the compensation circuit is less than the targeted slew rate, and to decrease the reference current if the detected slew rate is greater than the targeted slew rate.

38. The radio base station of claim 37, wherein the delay locked loop comprises:
  a variable delay cell configured to generate a delayed clock signal from an input clock signal; and
  a phase detector circuit configured to generate a bias signal as a function of a phase error between clock edges in the input clock signal and the delayed clock signal.

39. The radio base station of claim 38, wherein the delay cell comprises a delay control input that receives the bias signal such that a delay of the delay cell adjusts responsive to the bias signal.

40. The radio base station of claim 38, wherein the amplifier in the switched capacitor circuit comprises a first transistor amplifier, and wherein the compensation circuit further comprises a second transistor amplifier that has a known device scaling relative to the first transistor amplifier, and wherein the bias signal biases both the first and second transistor amplifiers.

41. The radio base station of claim 37, wherein the compensation circuit further comprises a clock regeneration circuit configured to receive an input clock signal at an input clock frequency and with an unknown duty cycle, and to generate an output clock signal at the input clock frequency and with a desired duty cycle, and wherein the clock regeneration circuit further comprises a clock output coupled to the switched capacitor circuit such that the output clock signal clocks the switched capacitor circuit.

* * * * *